(12) United States Patent
Khalili Amiri

(10) Patent No.: US 9,450,020 B2
(45) Date of Patent: Sep. 20, 2016

(54) MULTIPLE-BITS-PER-CELL VOLTAGE-CONTROLLED MAGNETIC MEMORY

(71) Applicant: THE REGENTS OF THE UNIVERSITY OF CALIFORNIA, Oakland, CA (US)

(72) Inventor: Pedram Khalili Amiri, Los Angeles, CA (US)

(73) Assignee: THE REGENTS OF THE UNIVERSITY OF CALIFORNIA, Oakland, CA (US)

(*) Notice: Subject to any disclaimer, the term of this patent is extended or adjusted under 35 U.S.C. 154(b) by 0 days.

(21) Appl. No.: 14/562,978

(22) Filed: Dec. 8, 2014

(65) Prior Publication Data

US 2015/0137289 A1    May 21, 2015

Related U.S. Application Data

(63) Continuation of application No. PCT/US2013/052556, filed on Jul. 29, 2013.

(60) Provisional application No. 61/677,380, filed on Jul. 30, 2012.

(51) Int. Cl.
| | |
|---|---|
| H01L 27/22 | (2006.01) |
| G11C 11/16 | (2006.01) |
| G11C 11/56 | (2006.01) |
| H01L 43/02 | (2006.01) |
| H01L 43/08 | (2006.01) |
| H01L 43/10 | (2006.01) |
| H01L 43/12 | (2006.01) |

(52) U.S. Cl.
CPC ............ *H01L 27/222* (2013.01); *G11C 11/16* (2013.01); *G11C 11/5607* (2013.01); *G11C 11/5657* (2013.01); *H01L 43/02* (2013.01); *H01L 43/08* (2013.01); *H01L 43/10* (2013.01); *H01L 43/12* (2013.01)

(58) Field of Classification Search
CPC ..... H01L 27/222; H01L 43/02; H01L 43/08; H01L 43/10; H01L 43/12
See application file for complete search history.

(56) References Cited

U.S. PATENT DOCUMENTS

| | | | |
|---|---|---|---|
| 6,730,949 B2 | 5/2004 | Kishi et al. | |
| 8,374,025 B1* | 2/2013 | Ranjan | B82Y 10/00 365/148 |
| 8,446,761 B2* | 5/2013 | Apalkov | G11C 11/16 257/421 |
| 9,036,407 B2* | 5/2015 | Wang | G11C 11/161 365/158 |
| 9,129,691 B2* | 9/2015 | Khalili Amiri | G11C 11/161 |
| 2008/0106933 A1 | 5/2008 | Lim | |
| 2010/0091564 A1* | 4/2010 | Gao | B82Y 25/00 365/171 |

(Continued)

OTHER PUBLICATIONS

Korean Intellectual Property Office (KIPO), International Search Report and Written Opinion, PCT/US2013/052556, issued Nov. 19, 2013, pp. 1-10, with claims searched, pp. 11-17.

*Primary Examiner* — Christine Enad
(74) *Attorney, Agent, or Firm* — O'Banion & Ritchey LLP; John P. O'Banion

(57) ABSTRACT

Voltage controlled magneto-electric tunnel junctions and memory devices are described which provide efficient high speed voltage switching of non-volatile magnetic devices (MeRAM) at high cell densities. A multi-bit-per-cell (MBPC) MeRAM is described which requires only a single transistor to write and read two data bits from the one MBPC MeRAM cell.

20 Claims, 12 Drawing Sheets

(56) References Cited

U.S. PATENT DOCUMENTS

| | | |
|---|---|---|
| 2010/0188891 A1 | 7/2010 | Taniguchi et al. |
| 2010/0219491 A1* | 9/2010 | Lee .................. B82Y 25/00 257/421 |
| 2010/0271870 A1 | 10/2010 | Zheng et al. |
| 2011/0031569 A1* | 2/2011 | Watts ................ B82Y 25/00 257/421 |
| 2013/0148418 A1* | 6/2013 | Luo .................. G11C 11/1675 365/158 |
| 2013/0230741 A1* | 9/2013 | Wang ................. G11B 5/82 428/826 |

* cited by examiner

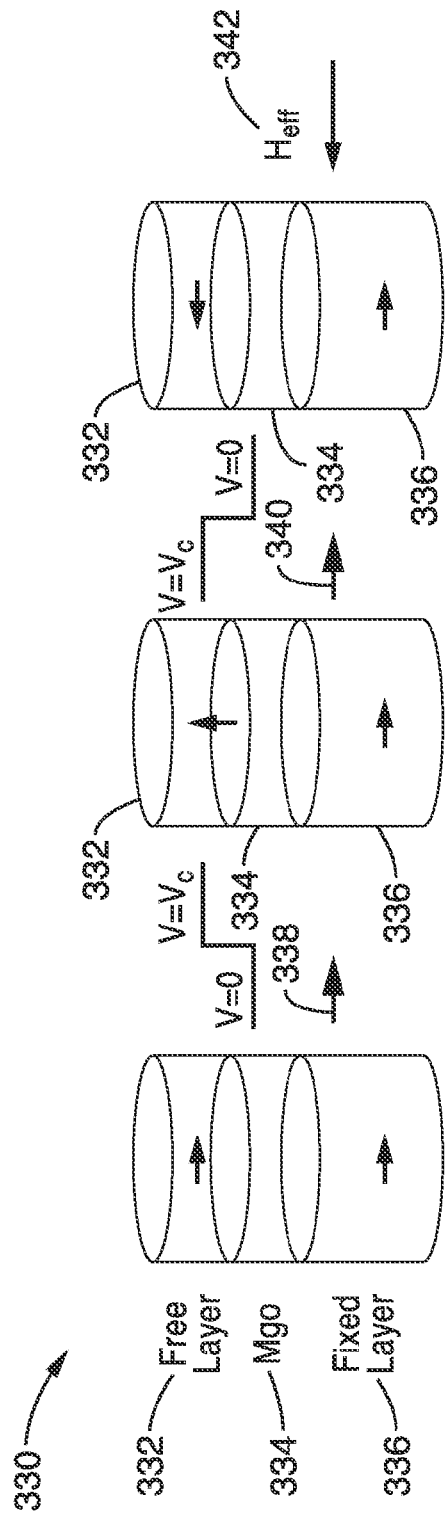
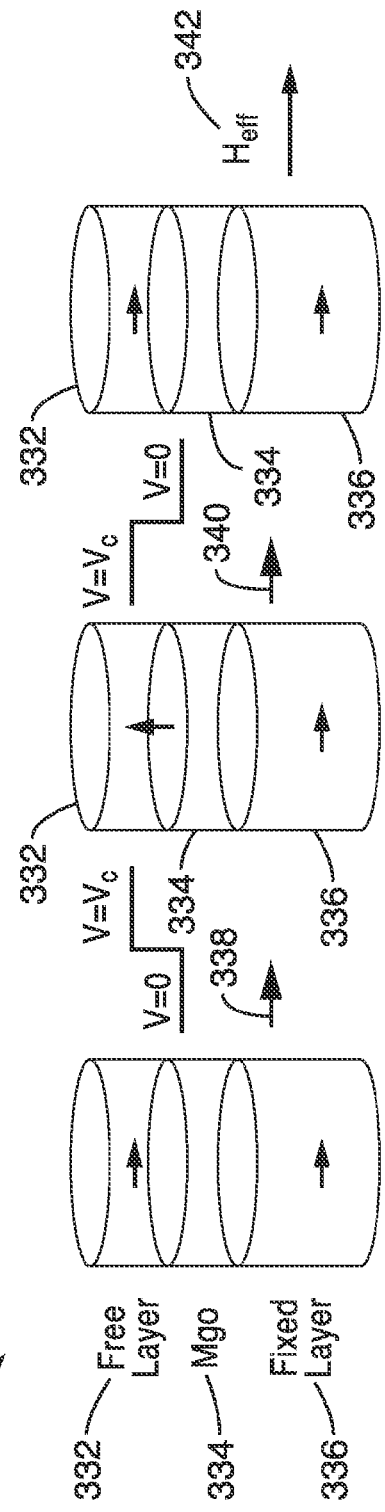

MULTIPLE-BITS-PER-CELL VOLTAGE-CONTROLLED MAGNETIC MEMORY

CROSS-REFERENCE TO RELATED APPLICATIONS

This application is a 35 U.S.C. §111(a) continuation of PCT international application number PCT/US2013/052556 filed on Jul. 29, 2013, incorporated herein by reference in its entirety, which claims priority to, and the benefit of, U.S. provisional patent application Ser. No. 61/677,380 filed on Jul. 30, 2012, incorporated herein by reference in its entirety. Priority is claimed to each of the foregoing applications.

The above-referenced PCT international application was published as PCT International Publication No. WO 2014/022304 on Feb. 6, 2014, which publication is incorporated herein by reference in its entirety.

STATEMENT REGARDING FEDERALLY SPONSORED RESEARCH OR DEVELOPMENT

This invention was made with Government support under HR0011-10-C-0153, awarded by the Defense Advanced Research Projects Agency. The Government has certain rights in the invention.

INCORPORATION-BY-REFERENCE OF MATERIAL SUBMITTED IN A COMPUTER PROGRAM APPENDIX

Not Applicable

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. §1.14.

BACKGROUND

1. Technical Field

This technology pertains generally to magnetic random access memory (MRAM), and more particularly to multiple bit-per-cell magnetoelectric random access memory (MBPC-MeRAM).

2. Background Discussion

Modern electronic devices increasingly incorporate significant amounts of solid state memory. The electronics industry continually seeks higher density devices that provide low power consumption. Magnetic memory devices by their nature provide non-volatile characteristics, and are drawing increasing attention as a next generation memory type.

Magnetic Random Access Memory (MRAM) has generally been implemented with a magnetic-field-controlled or electric-current-controlled write mechanism. Data within an MRAM is not stored as electric charge or current flows, as in a conventional RAM, but instead by magnetic storage elements formed from ferromagnetic plates, separated by insulating material. In a magnetoresistive RAM, reading is performed in response to measuring electrical resistance of the cell, which changes due to the orientation of the fields in the two plates. Data writes are performed by inducing a magnetic field in response to current through write lines to change magnetic orientation.

More recently, spin transfer torque (STT) techniques used spin-aligned ("polarized") electrons to directly torque the domains. In particular, if the electrons flowing into a layer are forced to change their spin, this will develop a torque that will be transferred to the nearby layer. Using STT, power requirements are substantially lowered. There has been a significant amount of research and development on STT-RAM, where electric currents are driven through a magnetic tunnel junction (MTJ) bit to switch it and thus to write information into it. The use of currents for writing STT-RAM, however, still involves substantial energy dissipation, and provides a limited maximum memory array density since each magnetic bit requires a large access transistor to drive its large write current, which also limits its scalability.

BRIEF SUMMARY

Accordingly, a need exists for high density and highly energy efficient magnetic memory devices. The technology described herein fulfills this need and overcomes shortcomings of previous magnetic memory devices.

A multiple bit-per-cell (MBPC) voltage controlled magnetoelectric random access memory (MeRAM) which switches multiple (two) ferromagnetic free layers of the memory cell in response to different voltage amplitudes and polarities to allow writing more than two states into the cell (i.e., more than 1 binary bit of information). Utilizing two ferromagnetic free layers, the technology described herein can write four states (2 bits) into a single magnetic memory cell controlled by a single transistor. Utilizing different resistive characteristics (e.g., thickness, dielectric properties, etc.) of the dielectric layers associated with different ferromagnetic free layers allows distinguishing the different cell states when reading the cell by measuring different tunneling resistances.

Further aspects of the technology described herein will be brought out in the following portions of the specification, wherein the detailed description is for the purpose of fully disclosing preferred embodiments of the technology without placing limitations thereon.

BRIEF DESCRIPTION OF THE SEVERAL VIEWS OF THE DRAWING(S)

The technology of the present disclosure will be more fully understood by reference to the following drawings which are for illustrative purposes only:

FIG. 8A and FIG. 8B are schematics of in-plane switching of a single FM free layer according to an aspect of the technology described herein.

DETAILED DESCRIPTION

Figure 1:
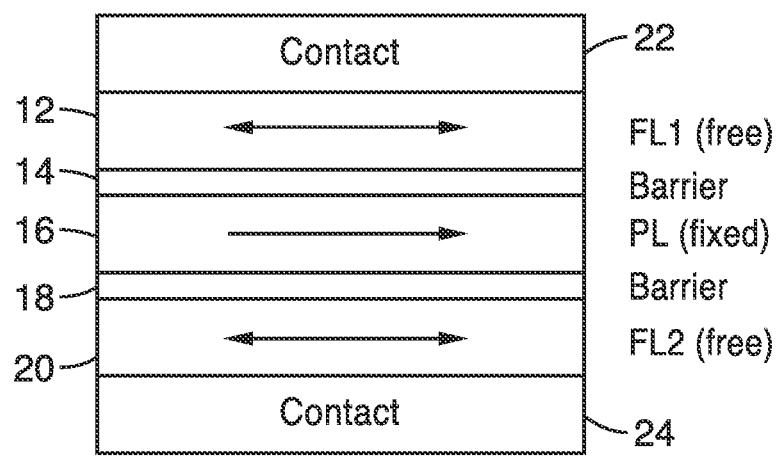
FIG. 1 is a schematic cross-section of a multi-bit-per-cell (MBPC) MeRAM according to an embodiment of the technology described herein, showing in-plane magnetization.

In our previous work on MeRAM we implemented a 1-transistor/1-magneto-electric tunnel junction (MEJ) structure, where each bit is voltage-controlled, instead of being controlled by currents. It will be noted that the MEJ structure can also be generally referred to as VMTJ or HMTJ for voltage-controlled or high-resistance MTJ. This one transistor per bit configuration limited the density of the resulting nonvolatile memory circuit, since the area which stores one bit of information is determined by lithography limits, for example by the minimum size of a transistor than can be fabricated at each node. Our prior MeRAM implementations thus could achieve densities comparable to dynamic random access memory (DRAM), of approximately $8F^2$, with F being the smallest feature size. This level of density is lower than achievable with high-density memories such as NAND or NOR Flash, which offer a density of about $4F^2$.

The technology described herein improves MeRAM density by utilizing a new magnetic memory cell structure, in which each cell stores two bits of information rather than one. This new structure effectively doubles the density of the resulting memory array, by storing two bits in each MEJ, while still preserving the 1-transistor/1-MEJ structure. Each transistor now accesses two bits of information for read or write, by using opposite voltage polarities to access each bit individually. In response to this inventive structure the multi-bit-per-cell MBPC-MeRAM doubles the density of prior MeRAM devices by using both voltage polarities, rather than only one, to write information. Interoperable with the use of polarities is the use of different dielectric resistance characteristics so that the four cell states can be distinguished when reading the cell. Different switching directions (i.e., set/reset) for each bit are determined by the voltage amplitude or pulse width, as in regular MeRAM, while the voltage polarity is used to determine which bit is accessed for set/reset.

In our previous single-bit-per-cell MeRAM, each memory cell has the following attributes. (a) Information is stored in the state of a magnetic bit (i.e., in a free layer, FL), with an in-plane or out-of-plane magnetization. (b) The FL magnetization can be switched from one state to another using an applied voltage (i.e., electric field), which modifies the perpendicular anisotropy of the free layer. (c) The direction of FL switching is determined by the magnitude of the applied voltage. (d) Alternatively, the direction of FL switching is determined by the duration of the applied voltage pulse. (e) FL is only sensitive to voltages of a particular polarity (e.g., positive), with the opposite polarity (e.g., negative) having no switching effect on FL magnetization.

The magnetic bit in our previous single-bit-per-cell MeRAM comprised at least the following layers, in addition to metal contacts. (1) A ferromagnetic (FM) free layer (e.g., Fe, Co, CoFe, or CoFeB). (2) A ferromagnetic (FM) fixed layer (e.g., Fe, Co, CoFe, or CoFeB). (3) A dielectric (DE) tunnel barrier (e.g., MgO).

In the above structure, the fixed layer can be exchange biased by an antiferromagnetic film (e.g., PtMn or IrMn). The fixed layer may also be replaced by a synthetic antiferromagnet (SAF). The overall structure exhibits tunneling magnetoresistance (TMR) which allows for reading of the magnetic state of the FL by measuring the resistance across the stack. The DE layer is chosen to be sufficiently thick to limit leakage to only a small leakage current when voltages lower than the breakdown voltage are applied. The free layer may additionally be adjacent to a thin metallic layer which acts both as part of the bottom or top electrode, as well as to enhance perpendicular anisotropy and voltage control of magnetization (e.g. Ta, Ru, Pt, Hf, Gd, or Pd).

In the single-bit-per-cell MeRAM, the ferromagnetic FL has an in-plane (IP) and an out-of-plane (OOP) perpendicular anisotropy. The OOP anisotropy is affected by the FM/DE interface, and can be controlled by the electric field (i.e., voltage) applied across the DE layer. The OOP anisotropy is increased or reduced depending on the polarity of the applied voltage (i.e., direction of the electric field). The OOP anisotropy can additionally be tuned by controlling the FM composition (e.g., higher OOP anisotropy for higher Fe content in CoFeB), and the FM thickness (OOP anisotropy is larger for thinner films), as well as its capping or seed layer (e.g., significant OOP anisotropy for Ta adjacent to a CoFeB free layer). Additional information about operating characteristics of the single FM free layer is provided in FIG. 7A through FIG. 13.

In contrast to the previous single-bit-per-cell MeRAM, the inventive multi-bit-per-cell (MBPC) MeRAM has a memory cell with the following attributes. (a) Information is stored in the state of two magnetic bits, preferably in two different free layers, FL1 and FL2, within the same device cell. Each free layer has an in-plane (IP) or out-of-plane (OOP) magnetization. (b) Magnetization of each free layer FL1 and FL2 can be switched from one state to another (P-AP, or AP-P) using an applied voltage (i.e., electric field), which modifies the perpendicular anisotropy of that free layer. (c) Direction of FL switching is determined by the magnitude of the applied voltage, or alternatively by the duration of the applied voltage pulse. (d) Each FL is only sensitive to voltages of a particular polarity (e.g., positive for FL1, negative for FL2, or vice versa), with the opposite polarity (e.g., negative for FL1, positive for FL2, or vice versa) which does not switch free layer magnetization.

An important element of the technology is that the overall device is implemented with at least two different free layers (FLs), with each being sensitive to a different voltage polarity. This is possible since the polarity of voltage to which each FL is sensitive is determined by its location in the stack, and more particularly whether it is located above or below an adjacent dielectric layer, as well as by the material used for the dielectric layer and the FL-DE interface properties, which provides interfacial magnetic anisotropy.

Figure 2:
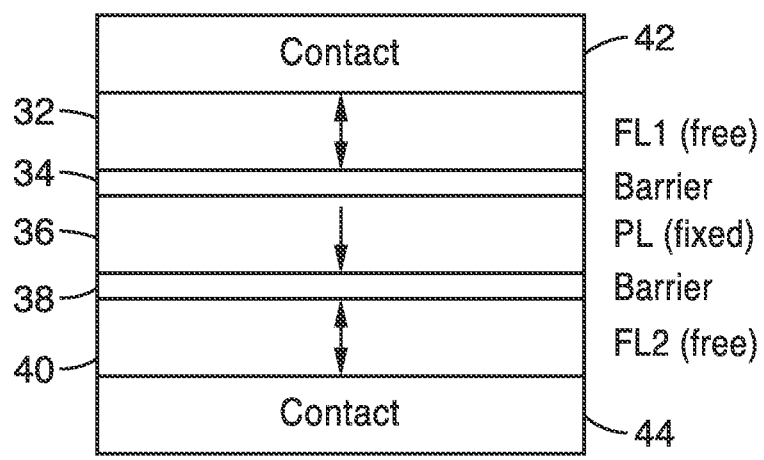
FIG. 2 is a schematic cross-section of a MBPC MeRAM according to an embodiment of the technology described herein, showing out-of-plane magnetization.

FIG. 1 and FIG. 2 illustrate example embodiments 10, 30, of 2-bit magnetic cells shown with in-plane magnetization in FIG. 1, and perpendicular magnetization in FIG. 2.

In FIG. 1 non-contact layers comprise a first ferromagnetic (FM) free layer FL1 (e.g., Fe, Co, CoFe, FePd, or CoFeB) 12, a first dielectric (DE) tunnel barrier DE1 (e.g., MgO) 14, a ferromagnetic (FM) fixed or pinned layer PL (e.g., Fe, Co, CoFe, FePd, or CoFeB) 16, a second dielectric (DE) tunnel barrier DE2 (e.g., MgO) 18, and a second ferromagnetic (FM) free layer FL2 (e.g., Fe, Co, CoFe, FePd, or CoFeB) 20. In example embodiment 10, arrows are shown indicating magnetization directions as being in-plane with the layers of the structure. Contacts 22, 24 (e.g., upper and lower, respectively) are seen on either side of the MEJ structure for the connection of the access transistor and bit lines.

In FIG. 2 a similar structure 30 is shown for perpendicular magnetization, in which the non-contact layers comprise a first ferromagnetic (FM) free layer FL1 32, a first dielectric (DE) tunnel barrier DE1 34, a ferromagnetic (FM) fixed or pinned layer PL 36, a second dielectric (DE) tunnel barrier DE2 38, and a second ferromagnetic (FM) free layer FL2 40. The material choices for FIG. 2 can be the same as that of FIG. 1, with the compositions, thicknesses, deposition and treatment conditions (such as heat treatment after deposition), or combinations thereof tailored to result in an out-of-plane (OOP) magnetization. The example embodiment 30 also depicts arrows to indicate magnetization directions as perpendicular to the layers of the structure. Contacts 42, 44 (e.g., upper and lower, respectively) are seen on either side of the MEJ structure for the connection of the access transistor and bit lines.

It should be appreciated that each of the free and fixed layers of the inventive embodiments may themselves comprise several sub-layers, that acting in combination provide the free or fixed layer functionality. An example is a synthetic antiferromagnetically coupled free or fixed layer, such as two CoFe or CoFeB films which are exchange-coupled through a thin metallic barrier such as Ruthenium (Ru). One of ordinary skill in the art will recognize that many such combinations can be configured to provide a fixed layer and a free layer. The free layer composition and capping (or seed) layers can be selected, such as to induce a large perpendicular magnetic anisotropy in it. Examples of capping or seed layer materials include Tantalum (Ta), Ruthenium (Ru), Hafnium (Hf), and Palladium (Pd), as well as thin layers of oxides such as MgO, and composition examples include CoFeB-based films, such as $Co_{40}Fe_{40}B_{20}$ or $Co_{20}Fe_{60}B_{20}$. It should be appreciated that the above are provided by way of example only, and the technology is by no means limited to these materials or compositions as it can be practiced across a range of other materials.

The fixed layer can be exchange biased by an antiferromagnetic film (e.g., PtMn or IrMn), or by a multilayer structure with perpendicular magnetic anisotropy (e.g., a multilayer of Co/Pd layers). It may also be replaced by a synthetic antiferromagnet (SAF) material stack. The overall structure exhibits tunneling magnetoresistance (TMR) which allows for reading of the magnetic state of each FL by measuring the resistance across the stack. It is preferable that the dielectric material of layers DE1 and DE2 (14, 18, 34, 38) be selected to have a large dielectric constant which is equal to or greater than approximately 10. The DE1 14, 34 and DE2 18, 38 layers are chosen to be thick enough to allow only a small leakage current when voltages lower than the breakdown voltage are applied. Each of the free layers FL1 12, 32 and FL2 20, 40 may additionally be adjacent to a thin metallic layer which acts both as part of the bottom or top electrode, as well as to enhance perpendicular anisotropy and voltage control of magnetization (e.g., Ta, Ru, Pt, Hf, or Pd).

The thickness of layers DE1 14, 34 and DE2 18, 38 is preferably chosen to realize different tunnel resistances across each of the tunnel barriers, so that overall the device exhibits four different resistance states, corresponding to the four different memory states to which it can be set (i.e., two bits, with each of FL1 and FL2 being anti-parallel (AP) or parallel (P) with respect to the fixed layer PL).

It should, however, be appreciated that different electrical resistance across the two DE layers can be obtained within the technology by various means, which is not limited to using different thicknesses of the DE layers. Aside from the thickness of the DE layer, DE resistive characteristics and interface may be changed to alter resistive properties according to the technology described herein. Examples of mechanisms for obtaining different electrical resistance across the two DE layers, include utilizing: (a) different compositions of the DE layers or their adjacent FM layers; (b) different interface properties at the interfaces of DE and FM layers, such as surface roughness; (c) different crystalline match; (d) insertion of sub-monolayer up to few-monolayers of an additional material at the interface; (e) different heat treatment of the DE layers after deposition of each layer, or (f) any desired combination of the above (a)-(e), or combinations of the above (a)-(e) along with different DE thickness.

As an example of these different resistance values, the sub-structure FL2-DE2-PL (20, 18, 16 or 40, 38, 36) can be implemented to have a resistance such as R2=200 Ohms in the P state, and the sub-structure FL1-DE1-PL (12, 14, 16 or 32, 34, 36) can be implemented for a resistance R1=100 Ohms in the P state, each with a TMR of 100%, thus resulting in corresponding AP resistances of 400 and 200 Ohms, respectively. The overall resistance for the above example will have four possible resistance levels corresponding to the four data states of the MBPC-MeRAM cell, as outlined below.

1. R1+R2=300 Ohms (FL1=P, FL2=P)
2. R1+2R2=500 Ohms (FL1=P, FL2=AP)
3. 2R1+R2=400 Ohms (FL1=AP, FL2=P)
4. 2R1+2R2=600 Ohms (FL1=AP, FL2=AP)

The above values of resistance are provided by way of example and not limitation. In practice the technology can be implemented with a wide range of resistance values.

Each ferromagnetic free layer FL1 and FL2 has both an in-plane (IP) and an out-of-plane (OOP) perpendicular anisotropy as made use of in the embodiments shown in FIG. 1 and FIG. 2. In the following descriptions, it should be appreciated that IP and OOP anisotropies represent tendencies of the magnetization to go into the IP or OOP state. Since both anisotropies are present in devices according to the technology, the actual state of the magnetization may differ from the IP and OOP configurations. Accordingly, it is important not to confuse axes of anisotropy and directions of magnetization, which may or may not be the same.

The OOP anisotropy is affected by the FM/DE interface, and can be controlled by the electric field (i.e., voltage) applied across the DE layer. The OOP anisotropy is increased or reduced depending on the polarity of the applied voltage (i.e., direction of the electric field), and the polarity of the interface (i.e., whether the FM is on top of or below the DE). The OOP anisotropy can additionally be tuned by controlling the FM composition (e.g., higher OOP anisotropy for higher Fe content in CoFeB), the DE composition, and the FM thickness (OOP anisotropy is larger for thinner films), as well as its capping or seed layer (e.g., significant OOP anisotropy for Ta adjacent to a CoFeB free layer).

Additionally, for each polarity of voltage, the amplitude determines whether P-AP or AP-P switching is performed. This can be achieved by a number of methods.

In one example, the spin transfer torque (STT) effect due to the leakage current for a voltage pulse with a larger amplitude is sufficient to promote one direction of switching (e.g., P-AP), while for smaller voltage amplitudes, where the STT effect is absent, the coupling field from the fixed layer promotes the opposite switching direction (e.g., AP-P). Consequently, different voltage amplitudes can be utilized to switch the free layer in opposite directions.

In another example, an additional interface (e.g., an additional semi-fixed magnetic layer with adjacent dielectric) is incorporated into the structure, resulting in a stray magnetic field acting on the free layer, which depends on the voltage amplitude. Accordingly, different voltage amplitudes can be designed to favor different free layer orientations, and thereby switch the free layer in opposite directions.

Furthermore, if the original pulse is timed to result in a precessional motion of the free layer magnetization, then the final state is determined by the pulse width utilized, rather than by stray fields. In this case, pulses timed at approximately ½ of the precessional period, or an odd multiple thereof, will switch the bit to the opposite state (e.g., P to AP, or AP to P), while pulses timed at one or multiple full precessional periods will not switch it. It should be noted that the pulse widths can deviate up to about 20% from the ½ precessional period, or multiple thereof, and still be effective.

The technology described herein utilizes the fact that the anisotropy increase or decrease is sensitive to interface polarity (i.e., whether the FM is on top of or below the DE for a particular set of FM and DE materials) to provide two layers which are switched by voltages of opposite polarities. By placing FL1 and FL2 on different sides of the two dielectric barriers DE1 and DE2, one can thereby ensure that each voltage polarity will only switch one of the ferromagnetic free layers.

Figure 3A:
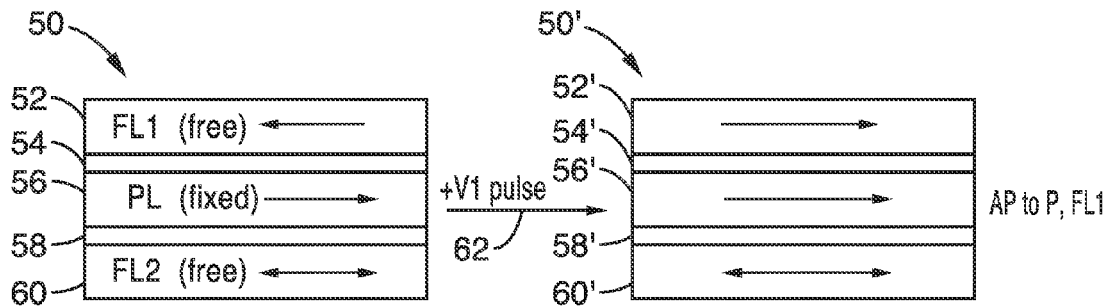
FIG. 3A through FIG. 3D are schematic cross-sections of a MBPC MeRAM having in-plane magnetization according to an embodiment of the technology described herein, shown switching to each of the four cell states in response to pulses +V1, +V2, −V3 and −V4.
Figure 3B:
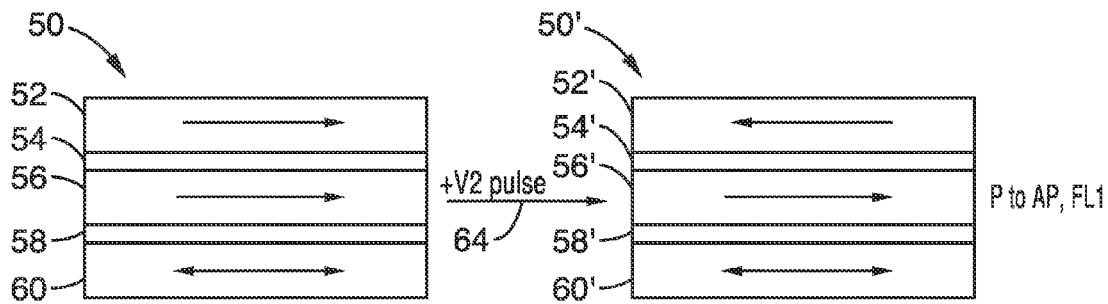
Figure 3C:
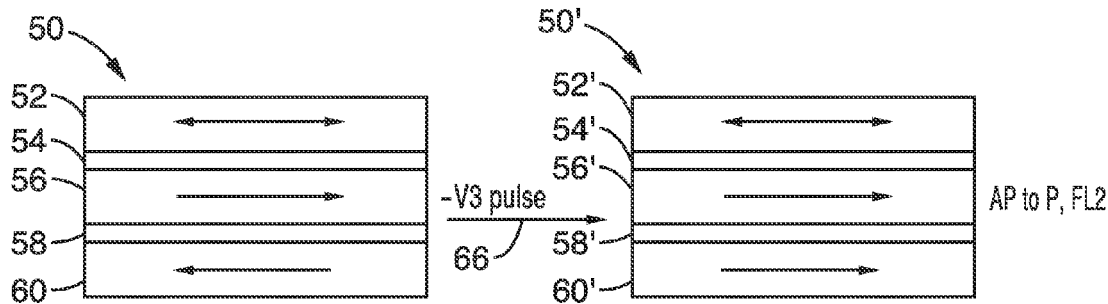
Figure 3D:
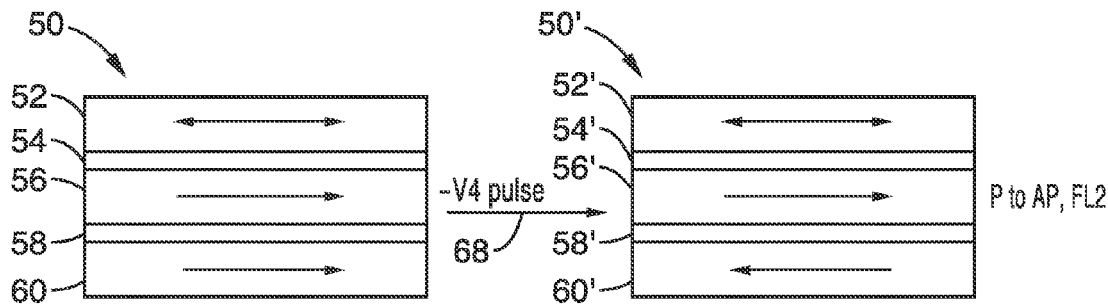

FIG. 3A through FIG. 3D and FIG. 4A through FIG. 4D illustrate four state switching of a single memory cell according to example embodiments 50, 70 having in-plane (IP) magnetization and out-of-plane (OOP) magnetization, respectively. For the sake of simplicity of illustration, conductive contacts are not depicted in these figures. Two FL layers 52, 60 are seen in FIG. 3A through FIG. 3D between which are disposed two dielectric layers 54, 58, between which is a fixed magnetization (FM) layer 56. In FIG. 3A switching is shown performed from AP to P in the FL1 layer in response to +V1 pulse 62. In FIG. 3B switching is performed from P to AP in the FL1 layer in response to +V2 pulse 64. The FL2 layer is shown controlled, with a −V3 pulse 66 in FIG. 3C causing switching from AP to P, while a −V4 pulse 68 in FIG. 3D causes switching of P to AP. It should be appreciated that the voltage used to provide set/reset switching at each polarity may comprise different voltage amplitudes, or it may comprise differing pulse widths of the same voltage level, or a combination thereof.

Figure 4A:
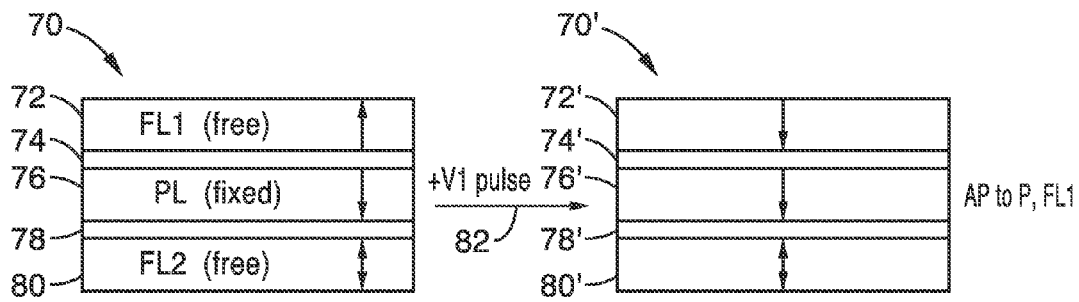
FIG. 4A through FIG. 4D are schematic cross-sections of a MBPC MeRAM having out-of-plane magnetization according to an embodiment of the technology described herein, shown switching to each of the four cell states in response to pulses +V1, +V2, −V3 and −V4.
Figure 4B:
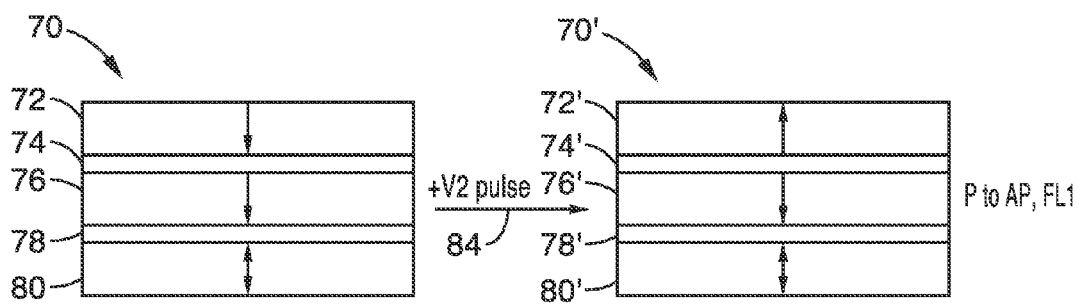
Figure 4C:
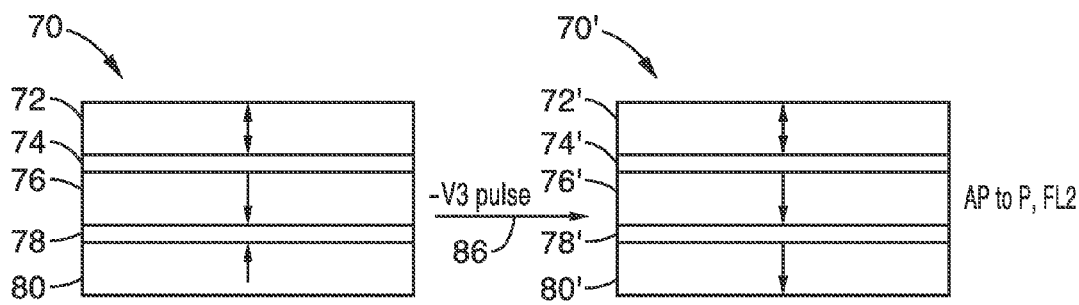
Figure 4D:
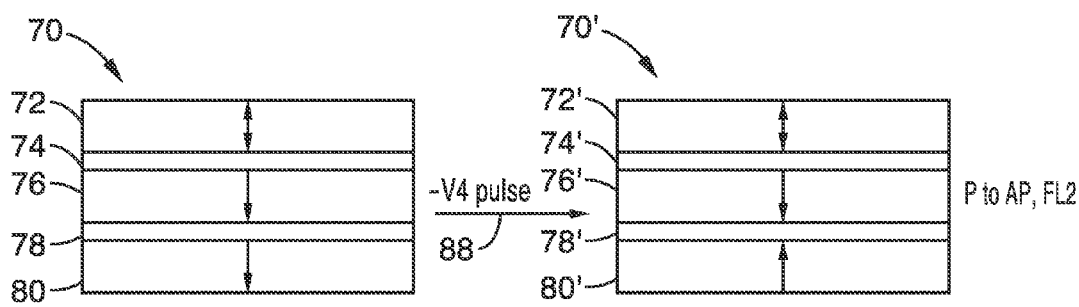

In FIG. 4A through FIG. 4D similar switching is shown for the non-planar (e.g., vertical) magnetization. FL layers 72, 80 are seen in FIG. 4A through FIG. 4D between which are disposed two dielectric layers 74, 78, between which is a fixed magnetization (FM) layer 76. In FIG. 4A switching is shown performed from AP to P in the FL1 layer in response to +V1 pulse 82. In FIG. 4B switching is performed from P to AP in the FL1 layer in response to +V2 pulse 84. The FL2 layer is shown controlled, with a −V3 pulse 86 in FIG. 4C causing switching from AP to P, while a −V4 pulse 88 in FIG. 4D causes switching of P to AP.

The following is provided by way of example and not limitation on switching performed at different voltage levels and polarities.

1. +0.5 V switches FL1 from AP to P, leaves FL2 unchanged
2. +1.0 V switches FL1 from P to AP, leaves FL2 unchanged
3. −0.5 V switches FL2 from AP to P, leaves FL1 unchanged
4. −1.0 V switches FL2 from P to AP, leaves FL1 unchanged The exact values of switching voltage are, of course, only given as examples, and the technology described herein can be implemented to provide switching across a range of different voltage levels without departing from the teachings of the technology described herein.

Figure 5:
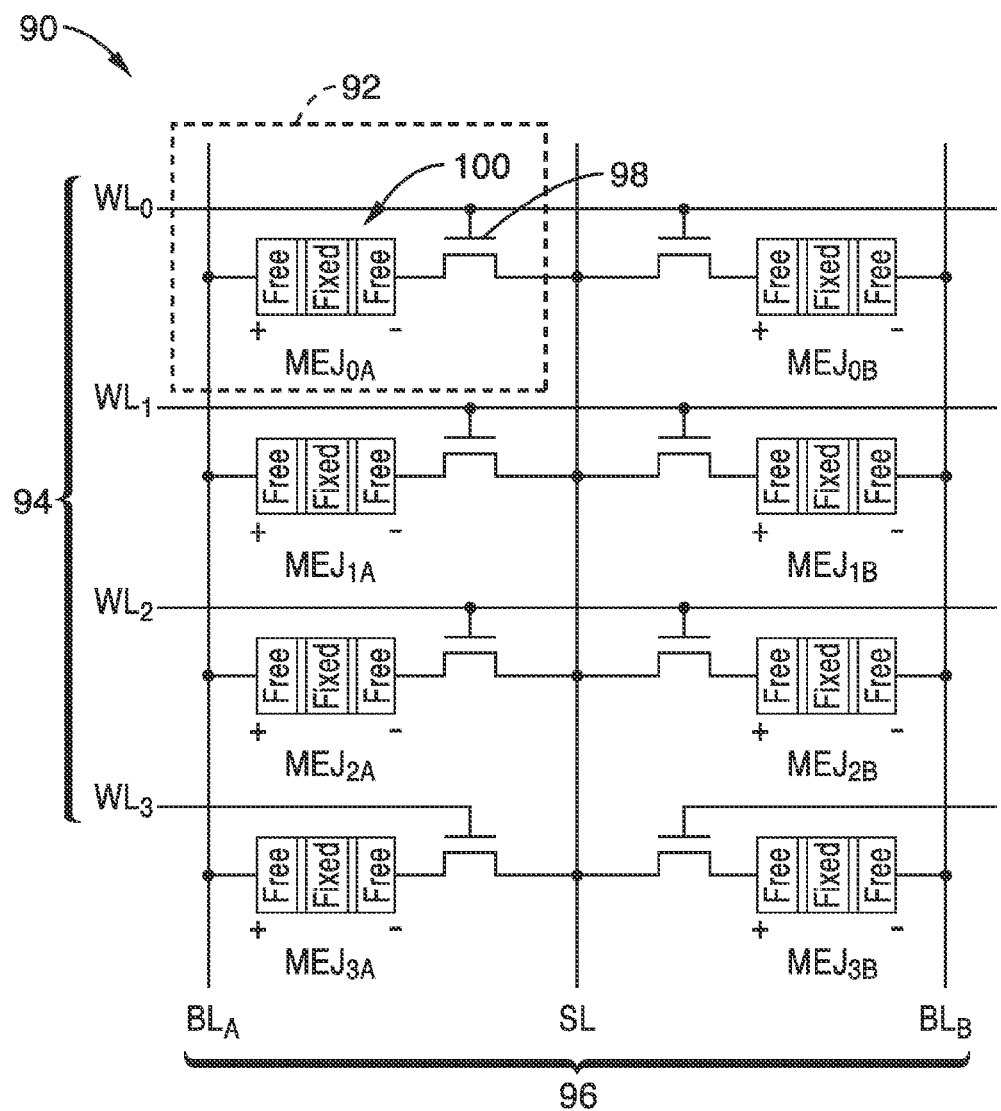
FIG. 5 is a schematic of an array of MBPC MeRAM cells shown interconnected to access transistors, word lines, source lines, and bit lines according to an embodiment of the technology described herein.

FIG. 5 illustrates an example embodiment 90 of an array of MBPC MeRAM cells 92. A plurality of word lines 94 are seen exemplified as four word lines $WL_0$-$WL_3$ coupled to array 90. Similarly, a group of bit lines 96 are shown with A and B bit lines ($BL_A$, $BL_B$) and source lines (SL) are seen coupled to the array. Each cell 92, contains a single voltage-controlled magneto-electric tunnel junction MEJ 100, depicted with two free FM layers and a fixed FM layer. Indicia $MEJ_{0A}$, $MEJ_{1A}$, $MEJ_{2A}$, $MEJ_{3A}$, $MEJ_{0B}$, $MEJ_{1B}$, $MEJ_{2B}$, $MEJ_{3B}$ are seen in the figure for each instance of these in the portion of the array which is exemplified. The MEJ structure can also be referred to as a VMTJ. A transistor 98 is shown in each cell for accessing the MEJ. Each cell is written by selecting its word line, and applying the needed write voltage and polarity (e.g., +V1, +V2, −V3, or −V4) to its source and bit lines. It will be appreciated that multiple bits can be simultaneously written. Reading is performed by selecting the cell's word line, then reading resistance across its bit and source line, with at least certain embodiments incorporating a sense amplifier. It will be noted that the read operation determined which of the four magnetic states the MEJ is in; and means that both bits of information are read simultaneously. The read voltage is lower than the write voltage to prevent disturbing cell contents. Each transistor 98 thereby is accessing (e.g., reading and writing) two memory bits within the cell, instead of a single bit as in previous MeRAM designs.

FIG. 6A through FIG. 6D illustrate example embodiments 110, 150, 190, 230 of material stacks that can be used to realize MBPC MeRAM memory cells according to the technology described herein.

Figure 6A:
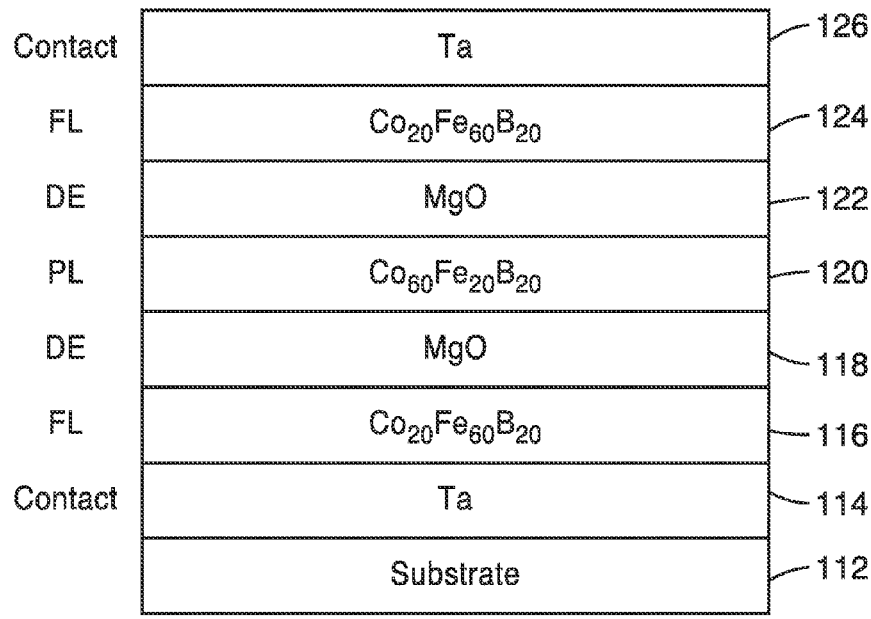
FIG. 6A through FIG. 6D are schematic cross-sections of material stacks according to embodiments of the technology described herein.

In FIG. 6A, embodiment 110, a substrate 112 is seen upon which is a first contact layer 114 of Ta, a first FL layer 116 of $Co_{20}Fe_{60}B_{20}$, a DE layer 118 of MgO, a fixed FM layer (PL) 120 of $Co_{60}Fe_{20}B_{20}$, a DE layer 122 of MgO, a second FL layer 124 of $Co_{20}Fe_{60}B_{20}$, and a contact layer 126 of Ta. Table 1 lists these layer compositions and thickness for an example embodiment.

Figure 6B:
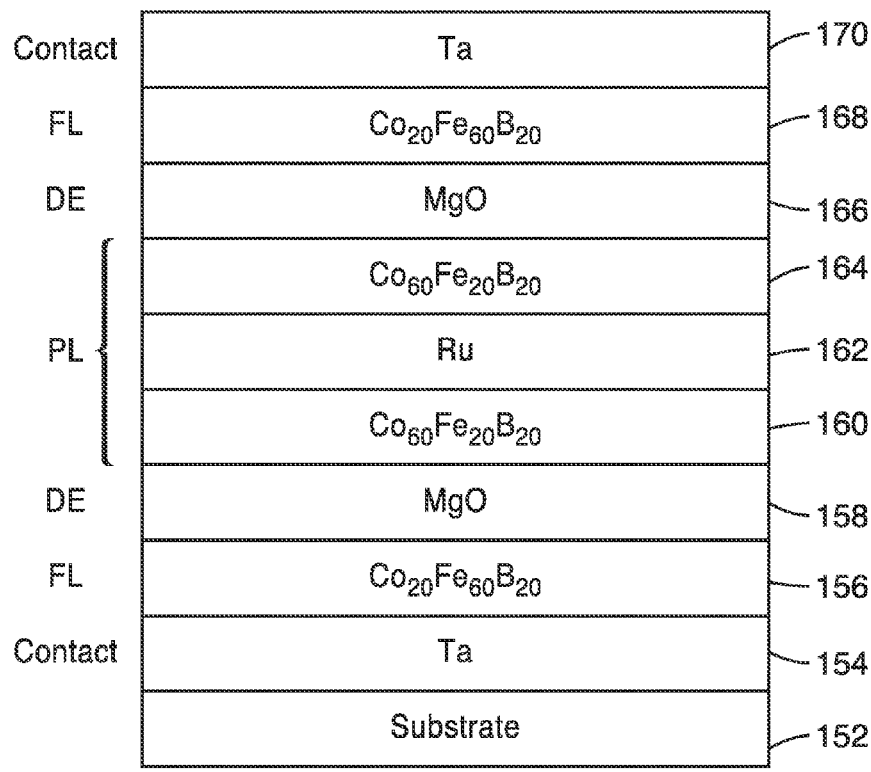

In FIG. 6B, embodiment 150, a substrate 152 is seen upon which is a first contact layer 154 of Ta, a first FL layer 156 of $Co_{20}Fe_{60}B_{20}$, a DE layer 158 of MgO, then a fixed FM layer (PL) having a combination of layers $Co_{60}Fe_{20}B_{20}$ 160, Ru 162, and $Co_{60}Fe_{20}B_{20}$ 164. Above the PL are seen another DE layer 166 of MgO, a second FL layer 168 of $Co_{20}Fe_{60}B_{20}$, and a contact layer 170 of Ta. Table 2 lists these layer compositions and thickness for an example embodiment.

Figure 6C:
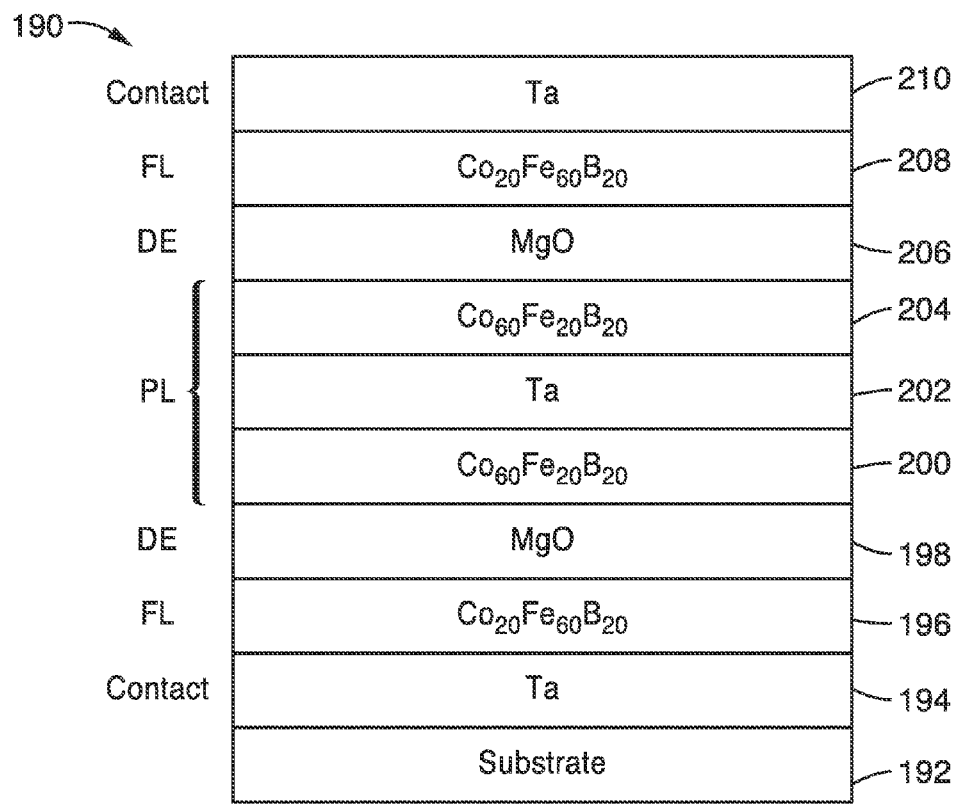

In FIG. 6C embodiment 190 a substrate 192 is seen upon which is a first contact layer 194 of Ta, a first FL layer 196 of $Co_{20}Fe_{60}B_{20}$, a DE layer 198 of MgO, then a fixed FM layer (PL) having a combination of layers $Co_{60}Fe_{20}B_{20}$ 200, Ta 202, and $Co_{60}Fe_{20}B_{20}$ 204. Above the PL are seen another DE layer 206 of MgO, a second FL layer 208 of $Co_{20}Fe_{60}B_{20}$, and a contact layer 210 of Ta. Table 3 lists these layer compositions and thickness for an example embodiment.

Figure 6D:
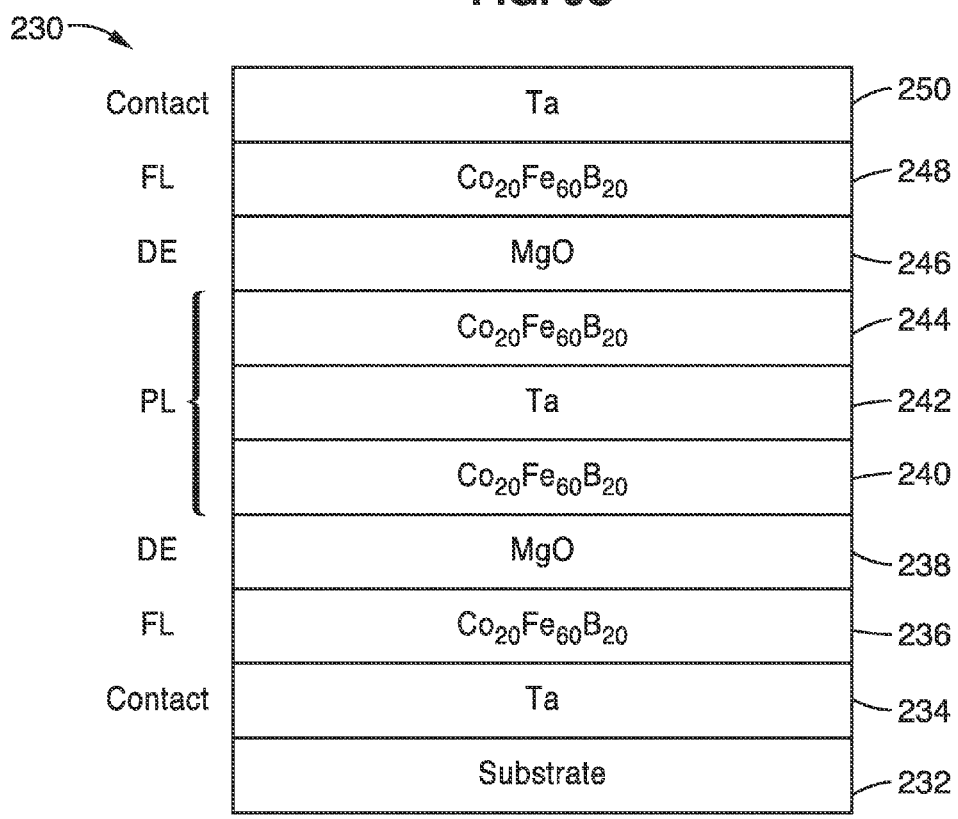

In FIG. 6D embodiment 230 a substrate 232 is seen upon which is a first contact layer 234 of Ta, a first FL layer 236 of $Co_{20}Fe_{60}B_{20}$, a DE layer 238 of MgO, then a fixed FM layer (PL) having a combination of layers $Co_{20}Fe_{60}B_{20}$ 240, Ta 242, and $Co_{20}Fe_{60}B_{20}$ 244. Above the PL are seen another DE layer 246 of MgO, a second FL layer 248 of $Co_{20}Fe_{60}B_{20}$, and a contact layer 250 of Ta. It will be noted that FM layers 240, 244 of the PL, differ from those of FIG. 6A-6C, and are the same composition as FL layers 236, 248 in this figure. Table 4 lists these layer compositions and thickness for an example embodiment.

It will be appreciated that the exemplified material stacks are given by way of examples, and not limitation. Other materials and combinations can be utilized without departing from the teachings of the technology described herein. It should also be realized that the thickness of the material utilized in different layers, as well as exact choice and composition of materials, may be varied depending on application and deposition system used. In creating these stacks it should be recognized that normally the stack should be annealed after deposition to improve crystal structure, increase TMR, and improve voltage-control and perpendicular anisotropy properties, although limited functionality may also be achieved without annealing. The optimal annealing temperature varies depending on the materials used, but will generally be in the range of about 150° C. to 450° C.

Layers 116, 124 in FIG. 6A (Table 1 layers 2 and 6), and layers 156, 168, 196, 208, 236, 248 in FIG. 6B through FIG. 6D (Tables 2-4 layers 2 and 8) are free layers whose memory bit is addressed individually in response to voltage and polarity using the voltage-controlled magnetic anisotropy (VCMA) effect. Layers 160, 162, 164 in FIG. 6B, layers 200, 202, 204 in FIG. 6C, and layers 240, 242, 244 in FIG. 6D (Tables 2-4 layers 4-6) collectively comprise a shared fixed layer; that is a fixed layer split into multiple layers (two in this example) which are separated by another material, exemplified as a Ru or Ta film. In FIG. 6B (Table 2), the two parts of the fixed layer 160, 164 are antiferromagnetically coupled through the Ru layer 162 via exchange interaction, while in FIG. 6C and FIG. 6D (Tables 3-4) they are only coupled through magnetic dipole interaction. With respect to the CoFeB compositions; Co-rich or Fe-rich materials are used to promote larger IP or OOP anisotropy, respectively; however other compositions may be used to yield similar results depending on the desired device characteristics and the deposition system used. The free layer thickness in each case is chosen such that the FL magnetizations are in-plane (Tables 1-3) or out-of-plane (Table 4). The MgO thickness values are chosen to be different to result in different resistance values of the two junctions, thus allowing for readout of four different states of the memory cell, as outlined above. The Ta layers adjacent to both free layers (containing $B_{20}$ in this example) absorb part of the B from the free layer upon annealing, resulting in crystallization and increase of TMR, while also promoting larger perpendicular anisotropy and voltage control of magnetic anisotropy FIG. 7A through FIG. 13 provide additional information regarding voltage induced switching of a voltage-controlled magneto-electric tunnel junction. For the sake of simplicity, these are directed to a single FL, but the principles generally apply to multiple FL as described according to the technology described herein.

Figure 7A:
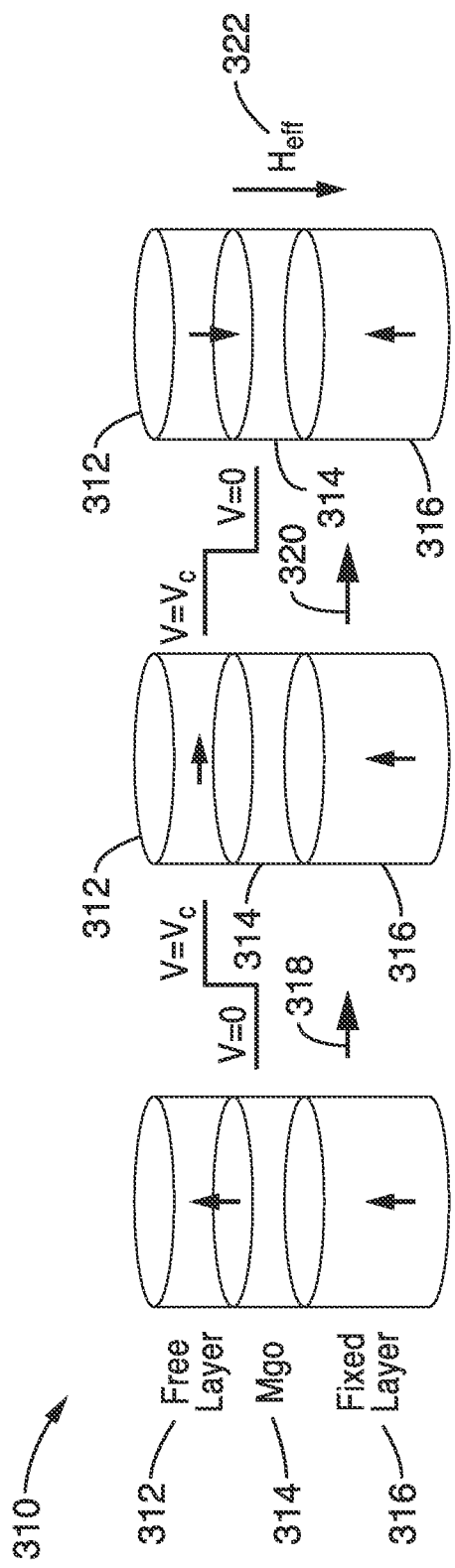
FIG. 7A and FIG. 7B are schematics of out-of-plane switching of a single FM free layer according to an aspect of the technology described herein.
Figure 7B:
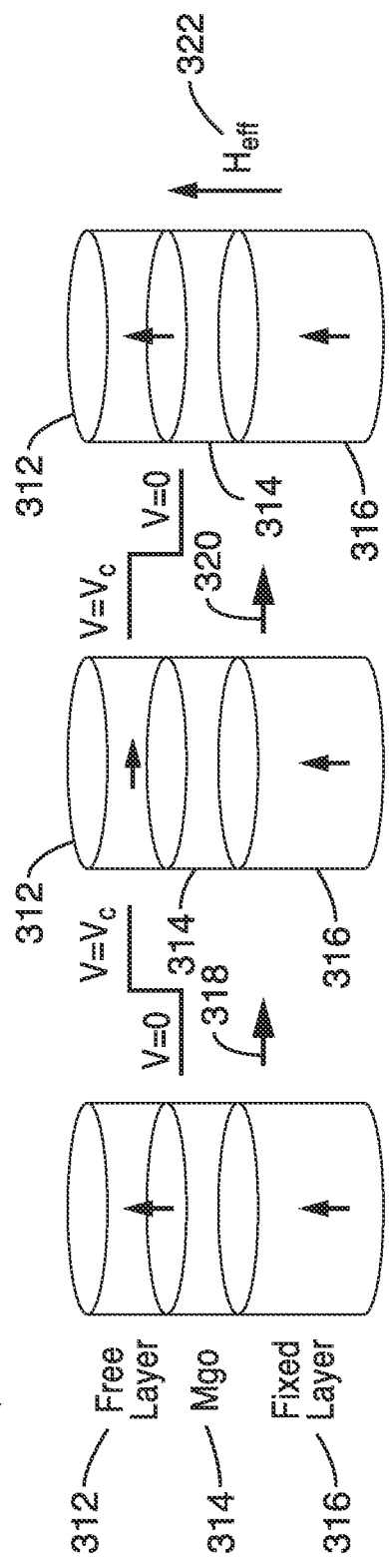

In the embodiment 310 of FIG. 7A and FIG. 7B, switching is seen for out-of-plane magnetization, while the embodiment 330 in FIG. 8A and FIG. 8B shows switching performed for in-plane magnetization. The figures depict a free layer 312, 332, in relation to a dielectric layer 314, 334, (e.g., MgO) and a fixed layer 316, 336. In regard to FIG. 7A through FIG. 8B, an applied pulse voltage 318, 338 forces the magnetization into a meta-stable state, which then relaxes to a (similar or different) stable state after the removal 320, 340 of the voltage. The final state 322, 342 depends on the direction of the overall magnetic field acting on the free layer, and can be controlled by applying a small external field. The role of the external field can be replaced by current-induced torques by allowing for a small leakage current to pass through the device, or by addition of a semi-fixed layer to the material stack, or by timing of the voltage pulse, as outlined above.

Figure 9:
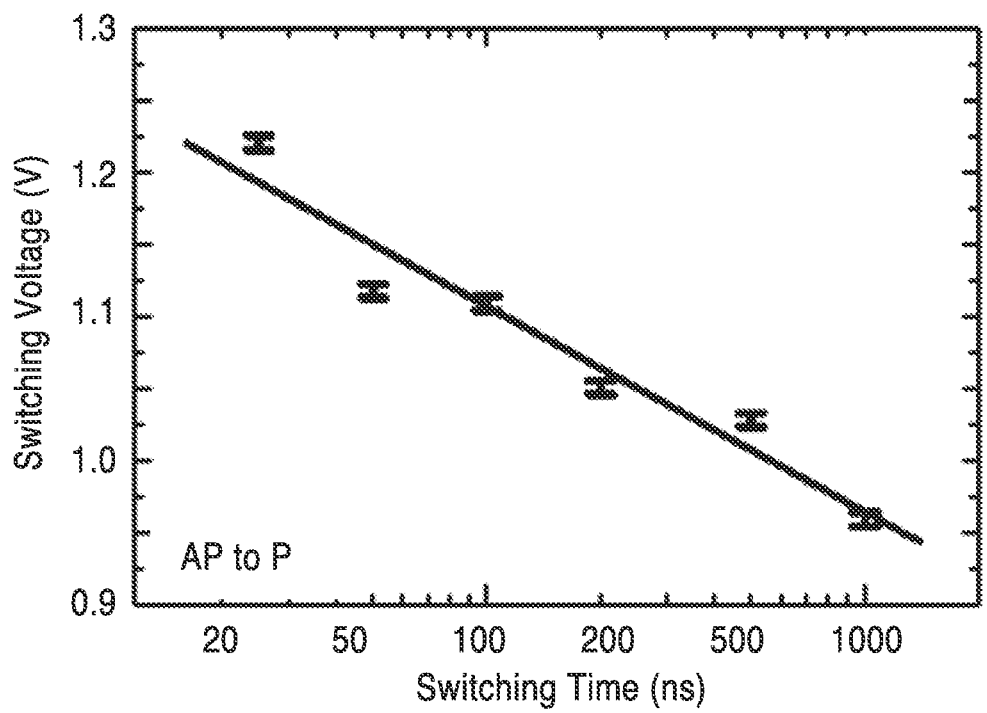
FIG. 9 and FIG. 10 are graphs of switching voltages for AP to P, and P to AP, respectively, for a MeRAM with a single FM free layer according to an aspect of the technology described herein.
Figure 10:
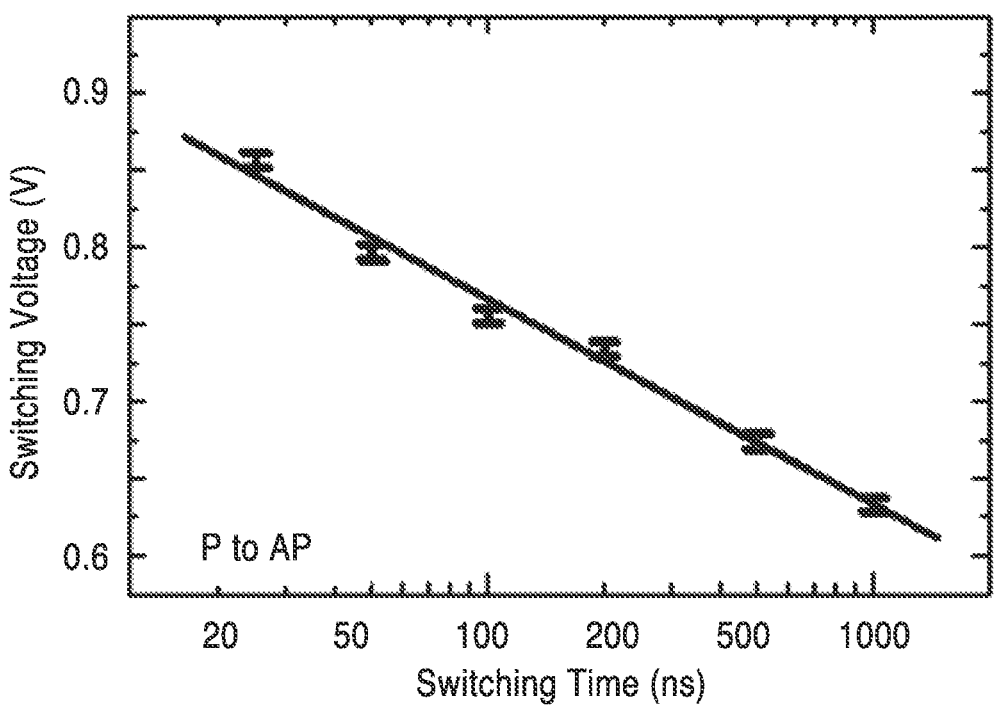

In FIG. 9 and FIG. 10, single bit switching voltages for AP to P and P to AP orientations, respectively, are seen as a function of pulse width for an in-plane magnetized 60 nm×170 nm high-resistance magneto-electric tunnel junction bit with a resistance-area product (RA) of approximately 1300Ω-μm² and a $Co_{20}Fe_{60}B_{20}$ (i.e., about 1.15 nm) free layer. Different switching directions were realized through small external magnetic fields (+60 Oe and −60 Oe, respectively), while the same voltage polarity was used in both cases, confirming the voltage-induced switching mechanism.

Figure 11:
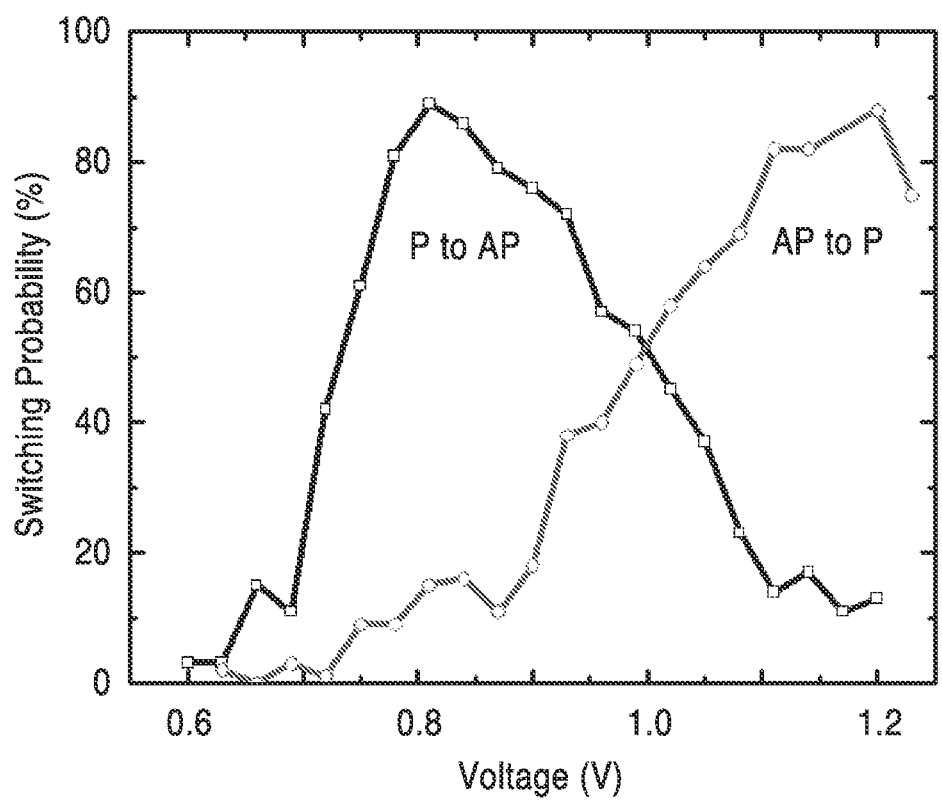
FIG. 11 is a graph of switching probability from P to AP, and AP to P, for a single bit MeRAM according to an aspect of the technology described herein.

In FIG. 11, switching probability was measured (e.g., based on 100 attempts with 100 ms long pulses) as a function of pulse voltage, for a 60 nm×190 nm MeRAM bit with an RA product of ~170Ω-μm². It will be noted that as in the case of FIG. 9 and FIG. 10, the same polarity of voltage was used for switching in both directions, while the pulse amplitude allowed for controlling the switching direction without the need for varying external magnetic fields.

Figure 12:
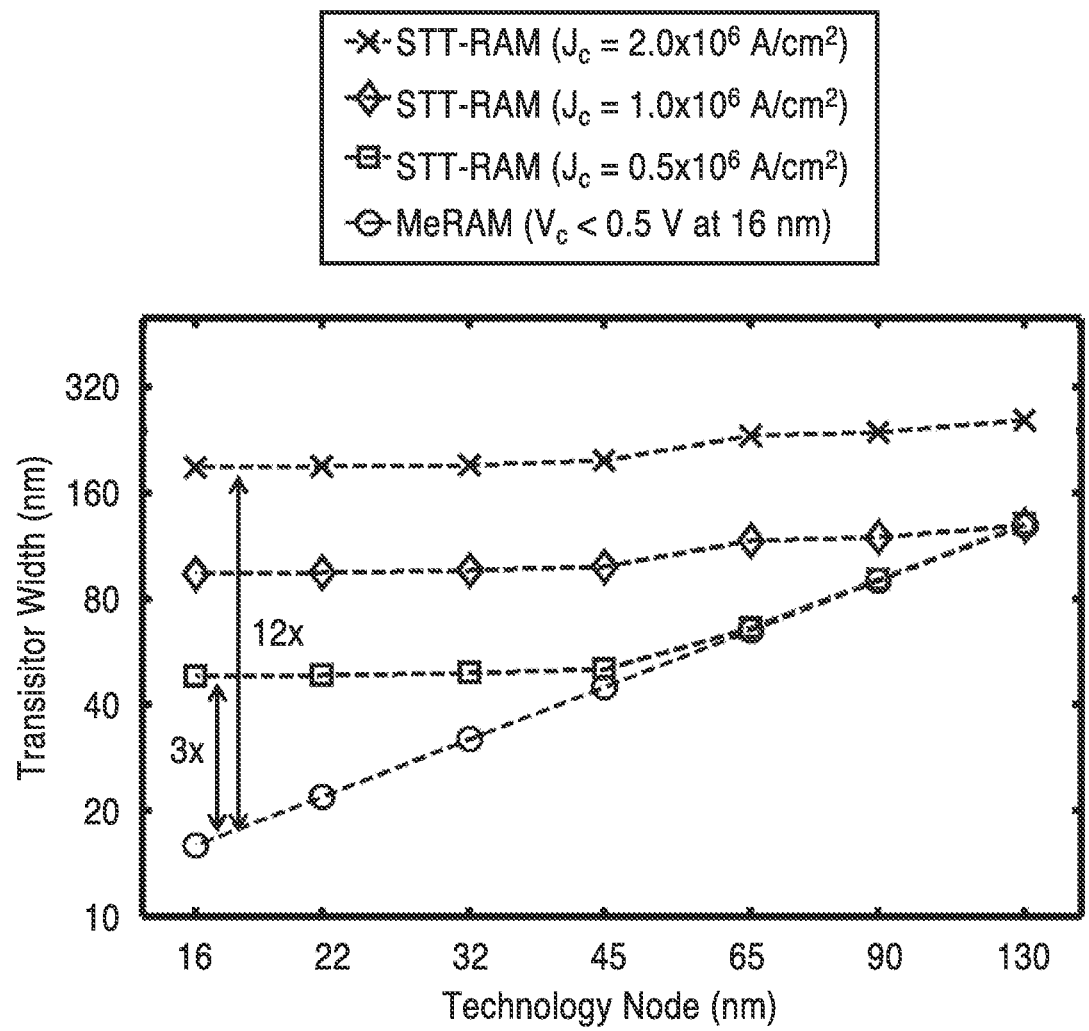
FIG. 12 is a graph of transistor width scaling for the case of a 1 bit 1-transistor MeRAM cell in comparison with STT RAM nodes down to 16 nm.

In FIG. 12, transistor width scaling is shown for the case of a 1 bit 1-transistor MeRAM cell in comparison with STT RAM nodes down to 16 nm. It should be appreciated that in the technology described herein the single transistor provides for switching 2 bits within the MBPC MeRAM.

Figure 13:
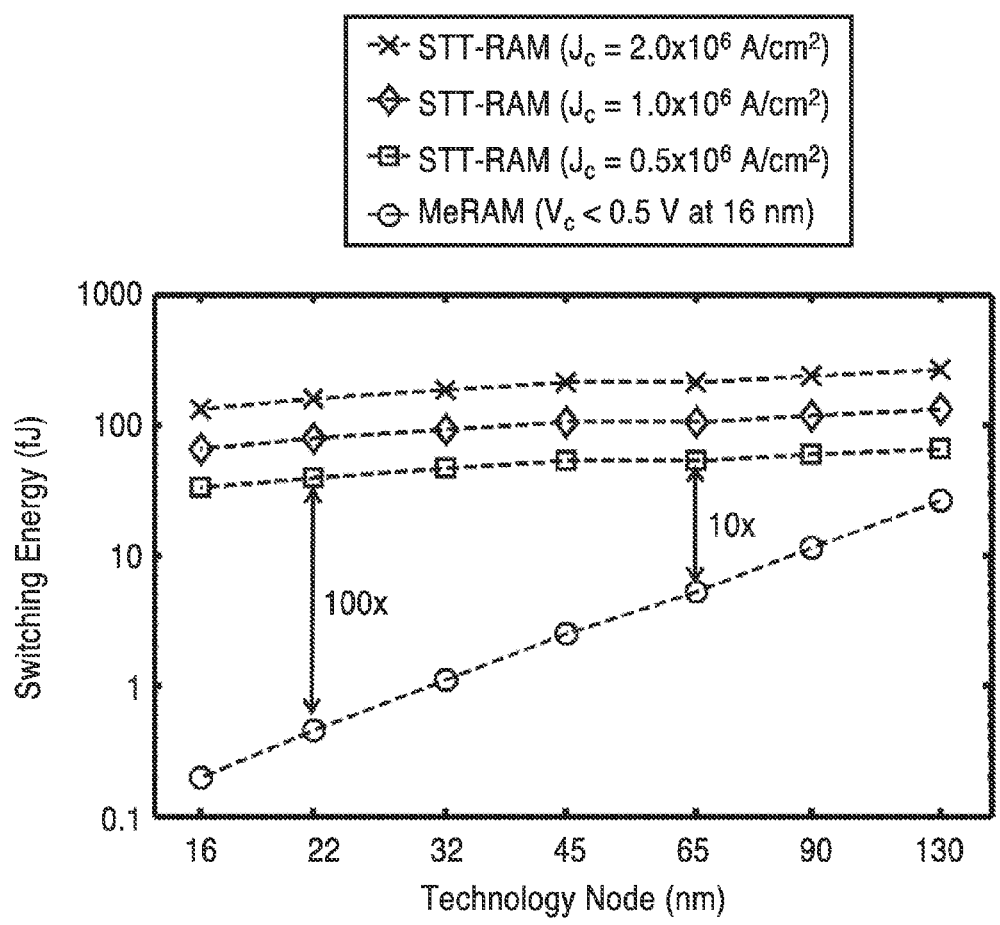
FIG. 13 is a graph of switching energy per bit for the case of a 1 bit 1-transistor MeRAM cell in comparison with STT RAM nodes down to 16 nm.

In FIG. 13, a comparison of switching energy per bit is shown for the case of a 1 bit 1-transistor MeRAM cell in comparison with STT RAM nodes down to 16 nm. It should be appreciated that in the technology described herein the energy per bit would refer to the energy required to switch each of the two bits in a single cell of the MBPC MeRAM.

The technology described herein provides for doubling the density of MeRAM memory arrays. It will be noted that existing magnetic RAM implementations, including STT-RAM, have limited density. STT-RAM currently achieves only densities comparable to or better than SRAM (i.e., approximately 20-40$F^2$ with F being the smallest feature size). The previous work of the inventor on single bit MeRAM implementation could reach densities comparable to dynamic random access memory (DRAM), i.e. ~8$F^2$, which was lower density than high-density memories such as NAND or NOR Flash. MBPC-MeRAM realizes a density similar to Flash memory (at ~4$F^2$), while retaining all other excellent characteristics of MeRAM, such as ultralow power dissipation, high speed, nonvolatility, very high endurance, and superior scalability.

In at least one embodiment, the technology described herein is implemented by integrating it with a CMOS technology below 90 nm, to achieve high density and low power.

From the discussion above it will be appreciated that the technology described herein can be embodied in various ways, including the following:

1. A voltage-controlled magnetic anisotropy (VCMA) switch apparatus, comprising: at least three ferromagnetic (FM) layers having at least one FM fixed layer and at least a first FM free layer, and a second FM free layer; a dielectric (DE) layer interposed between each of said FM layers separating them from one another; and wherein material, shape and thickness of said FM free layers and said FM fixed layer are selected to have in-plane (IP) and out-of-plane (OOP) anisotropies; wherein OOP anisotropy of said FM free layers is affected by interface properties between said FM layers and said DE layers, and is controlled by voltages applied across said DE layers as an applied voltage and polarity; wherein utilizing a voltage-controlled magnetic anisotropy (VCMA) effect a magnetization orientation of said first FM free layer is switched in response to voltages of a first polarity, while magnetization orientation of said second FM free layer is switched in response to voltages of a second polarity.

2. The apparatus of any previous embodiment, wherein said magnetization of each of said FM free layers is switchable between two magnetization orientation states that are either in-plane (IP) or out-of-plane (OOP).

3. The apparatus of any previous embodiment, wherein said magnetization orientation states are parallel (P) and anti-parallel (AP) with respect to magnetization orientation of said FM fixed layer.

4. The apparatus of any previous embodiment, wherein said apparatus switches magnetic states in response to voltage application of given polarities, and does not require a flow of electric charge currents through said apparatus or through a conductor disposed proximal said apparatus to perform said switching.

5. The apparatus of any previous embodiment, wherein said switching of magnetization orientation of each of said FM free layers is determined in response to the applied voltage which induces magnetization rotation and allows full switching to occur in response to presence of a stray magnetic field to switch magnetization to its final switched state in said first FM free layer and said second FM free layer.

6. The apparatus of any previous embodiment, wherein said at least one stray field arises from said ferromagnetic (FM) fixed layer.

7. The apparatus of any previous embodiment, wherein each said ferromagnetic (FM) free layer comprises one layer or a combination of layers.

8. The apparatus of any previous embodiment, wherein said ferromagnetic (FM) fixed layer comprises one layer or a combination of layers.

9. The apparatus of any previous embodiment, wherein said magnetization orientation is changed in response to width of a pulse of said voltage level of a selected polarity on an apparatus configured for precessional motion of magnetization.

10. The apparatus of any previous embodiment, wherein said apparatus comprises an in-plane (IP) voltage-controlled magnetic anisotropy (VCMA) switch apparatus having 2 bits per cell.

11. The apparatus of any previous embodiment, wherein said apparatus comprises an out-of-plane (OOP) voltage-controlled magnetic anisotropy (VCMA) switch apparatus having two bits per cell.

12. The apparatus of any previous embodiment, wherein magnetization orientation of said apparatus can be read by measuring electrical resistance through the FM free layers, DE layers, and FM fixed layer in response to tunneling magnetoresistance (TMR) properties.

13. The apparatus of any previous embodiment, wherein DE layer thickness differs between said first FM free layer and said FM fixed layer, and between said second FM free layer and said FM fixed layer, so that different tunneling resistances are created across each of the tunnel barriers leading to four different resistance states.

14. The apparatus of any previous embodiment, wherein said ferromagnetic material is selected from the group of ferromagnetic materials consisting of Fe, Co, Pt, Pd, FePd, CoFe, and CoFeB.

15. The apparatus of any previous embodiment, wherein said dielectric material comprises MgO.

16. The apparatus of any previous embodiment, wherein said dielectric material comprises a material with a large dielectric constant which is equal to or larger than approximately 10.

17. The apparatus of any previous embodiment, wherein said dielectric material is selected from the group of large dielectric constant materials consisting of Hafnium Oxide (HfOx), and Tantalum Oxide (TaOx).

18. The apparatus of any previous embodiment, wherein said OOP anisotropy is tuned by controlling FM composition including a ratio of Fe content, FM layer shape, and FM layer thickness.

19. The apparatus of any previous embodiment, wherein said OOP anisotropy is tuned by placing an additional non-magnetic metal layer adjacent to an FM layer, where said metal layer increases said OOP anisotropy or said VCMA effect.

20. The apparatus of any previous embodiment, where said metal layer comprises Tantalum (Ta) or Hafnium (Hf).

21. The apparatus of any previous embodiment, wherein said OOP anisotropy is tuned by placing an additional dielectric layer adjacent to an FM layer, where said dielectric layer increases said OOP anisotropy or said VCMA effect.

22. The apparatus of any previous embodiment, where said dielectric layer comprises Magnesium Oxide (MgO), Hafnium Oxide (HfOx), or Tantalum Oxide (TaOx).

23. The apparatus of any previous embodiment, further comprising at least one ferromagnetic (FM) semi-fixed layer disposed proximal said ferromagnetic (FM) fixed layer, and a spacer layer separating said FM semi-fixed layer from said FM fixed layer.

24. The apparatus of any previous embodiment, wherein said spacer layer comprises a metallic material that does not contribute to the voltage-controlled magnetic anisotropy of the apparatus.

25. The apparatus of any previous embodiment, wherein said apparatus is incorporated as multiple bits within a multi-bit-per-cell (MBPC) magneto-electric random access memory (MeRAM) in which bit state is written to different FM free layers in response to application of a first and second voltage levels, at a first and second polarity.

26. A voltage-controlled magnetic anisotropy (VCMA) switch apparatus, comprising: at least three ferromagnetic (FM) layers having at least one FM fixed layer and at least a first FM free layer, and a second FM free layer; wherein magnetization of each of said FM free layers is switchable between two magnetization orientation states, either parallel (P) or anti-parallel (AP), that are either in-plane (IP) or out-of-plane (OOP); a dielectric (DE) layer interposed between each of said FM layers separating them from one another; and wherein material, shape and thickness of said FM free layers and said FM fixed layer are selected to have in-plane (IP) and out-of-plane (OOP) anisotropies; wherein OOP anisotropy of said FM free layers is affected by interface properties between said FM layers and said DE layers, and is controlled by voltages applied across said DE layers as an applied voltage and polarity; wherein utilizing a voltage-controlled magnetic anisotropy (VCMA) effect a magnetization orientation of said first FM free layer is switched in response to voltage levels of a first polarity, while magnetization orientation of said second FM free layer is switched in response to voltage levels of a second polarity; and wherein said apparatus switches magnetic states in response to voltage application of given polarities.

27. A multi-bit-per-cell (MBPC) magneto-electric random access memory (MeRAM) device, comprising: (a) a plurality of word lines and bit lines; and (b) an array of multi-bit-per-cell (MBPC) magneto-electric random access memory (MeRAM) cells; (c) wherein each MBPC MeRAM cell comprises: (i) a combination of magneto-electric tunnel junction (MEJ); and (ii) an access transistor, with the combination configured for reading and writing MBPC MeRAM cells in response to signals from said word lines and bit lines; (iii) wherein each magneto-electric tunnel junction (MEJ) comprises: (1) at least three ferromagnetic (FM) layers having at least one FM fixed layer and at least a first FM free layer, and a second FM free layer; and (2) a dielectric (DE) layer interposed between each of said FM layers separating them from one another; (3) wherein material, shape and thickness of said FM free layers and said FM fixed layer are selected to have in-plane (IP) and out-of-plane (OOP) anisotropies; (4) wherein OOP anisotropy of said FM free layers is affected by interface properties between said FM layers and said DE layers, and is controlled by voltages applied across said DE layers as an applied voltage and polarity; and (5) wherein utilizing a voltage-controlled magnetic anisotropy (VCMA) effect a magnetization orientation of said first FM free layer is switched between two states in response to voltage levels of a first polarity, while magnetization orientation of said second FM free layer is switched between two states in response to voltage levels of a second polarity, thus providing 4 data states to each cell of said MBPC MeRAM.

28. A method of fabricating a voltage-controlled magnetic anisotropy (VCMA) switch apparatus having two bits per cell, comprising: fabricating a VCMA switch cell with at least three ferromagnetic (FM) layers comprising at least one FM fixed layer, and at least a first and second FM free layer, and separating each FM layer from one another by a dielectric (DE) layer; selecting material, shape and thickness of said FM free layers and said FM fixed layer to have in-plane (IP) and out-of-plane (OOP) anisotropies; selecting a different DE layer thickness, or resistive characteristics, between said first FM free layer and said FM fixed layer, and between said second FM free layer and said FM fixed layer, so that different tunneling resistances are created across each tunnel barrier leading to four different resistance states; and whereby said VCMA switch cell is configured for switching magnetization orientation of said first FM free layer between two states in response to a first and second voltage of a first polarity, and switching magnetization orientation of said second FM free layer between two states in response to a first and second voltage of a second polarity; and whereby said VCMA switch cell is configured to be switched into four unique states of magnetization orientation which can be read by measuring electrical resistance through FM free layers, DE layers, and FM fixed layer in response to tunneling magnetoresistance (TMR) properties.

Although the description herein contains many details, these should not be construed as limiting the scope of the disclosure but as merely providing illustrations of some of the presently preferred embodiments. Therefore, it will be appreciated that the scope of the disclosure fully encompasses other embodiments which may become obvious to those skilled in the art.

In the claims, reference to an element in the singular is not intended to mean "one and only one" unless explicitly so stated, but rather "one or more." All structural, chemical, and functional equivalents to the elements of the disclosed embodiments that are known to those of ordinary skill in the art are expressly incorporated herein by reference and are intended to be encompassed by the present claims. Furthermore, no element, component, or method step in the present disclosure is intended to be dedicated to the public regardless of whether the element, component, or method step is explicitly recited in the claims. No claim element herein is to be construed as a "means plus function" element unless the element is expressly recited using the phrase "means for". No claim element herein is to be construed as a "step plus function" element unless the element is expressly recited using the phrase "step for".

TABLE 1

Example 1 of MBPC MeRAM Material Stacks (see FIG. 6A)
Substrate

1. Ta (e.g., 5 nm)
2. $Co_{20}Fe_{60}B_{20}$ (e.g., 1.1 nm)
3. MgO (e.g., 1.1 nm)
4. $Co_{60}Fe_{20}B_{20}$ (e.g., 4 nm)
5. MgO (e.g., 1.0 nm)
6. $Co_{20}Fe_{60}B_{20}$ (e.g., 1.5 nm)
7. Ta (e.g., 5 nm)

TABLE 2

Example 2 of MBPC MeRAM Material Stacks (see FIG. 6B)
Substrate

1. Ta (e.g., 5 nm)
2. $Co_{20}Fe_{60}B_{20}$ (e.g., 1.1 nm)
3. MgO (e.g., 1.1 nm)
4. $Co_{60}Fe_{20}B_{20}$ (e.g., 2 nm)
5. Ru (e.g., 0.8 nm)
6. $Co_{60}Fe_{20}B_{20}$ (e.g., 2 nm)
7. MgO (e.g., 1.0 nm)
8. $Co_{20}Fe_{60}B_{20}$ (e.g., 1.5 nm)
9. Ta (e.g., 5 nm)

TABLE 3

Example 3 of MBPC MeRAM Material Stacks (see FIG. 6C)
Substrate

1. Ta (e.g., 5 nm)
2. $Co_{20}Fe_{60}B_{20}$ (e.g., 1.1 nm)
3. MgO (e.g., 1.1 nm)
4. $Co_{60}Fe_{20}B_{20}$ (e.g., 3 nm)
5. Ta (e.g., 5 nm)
6. $Co_{60}Fe_{20}B_{20}$ (e.g., 3 nm)
7. MgO (e.g., 1.0 nm)
8. $Co_{20}Fe_{60}B_{20}$ (e.g., 1.5 nm)
9. Ta (e.g., 5 nm)

TABLE 4

Example 4 of MBPC MeRAM Material Stacks (see FIG. 6D)
Substrate

1. Ta (e.g., 5 nm)
2. $Co_{20}Fe_{60}B_{20}$ (e.g., 1.0 nm)
3. MgO (e.g., 1.1 nm)
4. $Co_{20}Fe_{60}B_{20}$ (e.g., 1.2 nm)
5. Ta (e.g., 5 nm)
6. $Co_{20}Fe_{60}B_{20}$ (e.g., 0.8 nm)
7. MgO (e.g., 1.0 nm)
8. $Co_{20}Fe_{60}B_{20}$ (e.g., 1.4 nm)
9. Ta (e.g., 5 nm)

What is claimed is:

1. A voltage-controlled magnetic anisotropy (VCMA) switch apparatus, comprising:
    at least three ferromagnetic (FM) layers having at least one FM fixed layer and at least a first FM free layer, and a second FM free layer; and
    a dielectric (DE) layer interposed between each of said FM layers separating them from one another;
    wherein material, shape and thickness of said FM free layers and said FM fixed layer are selected to have in-plane (IP) and out-of-plane (OOP) anisotropies;
    wherein OOP anisotropy of said FM free layers is affected by interface properties between said FM layers and said DE layers, and is controlled by voltages applied across said DE layers as an applied voltage and polarity;
    wherein a magnetization orientation of said first FM free layer is switched in response to voltages of a first polarity, while magnetization orientation of said second FM free layer is switched in response to voltages of a second polarity by utilizing a voltage-controlled magnetic anisotropy (VCMA) effect;
    wherein said apparatus is configured for precessional motion of magnetization;
    wherein said magnetization orientation of said first FM free layer is changed in response to width of a pulse of a voltage level of a first polarity and said second FM free layer is changed in response to width of a pulse of a voltage level of a second polarity; and
    wherein width of each said pulse is timed at approximately one-half of the precessional period of each said FM free layer.

2. The apparatus recited in claim 1, wherein said magnetization of each of said FM free layers is switchable between two magnetization orientation states that are either in-plane (IP) or out-of-plane (OOP).

3. The apparatus recited in claim 1, wherein said magnetization orientation states are parallel (P) and anti-parallel (AP) with respect to magnetization orientation of said FM fixed layer.

4. The apparatus recited in claim 1, wherein said apparatus switches magnetic states in response to voltage application of given polarities, and does not require a flow of electric charge currents through said apparatus or through a conductor disposed proximal said apparatus to perform said switching.

5. The apparatus recited in claim 1, wherein said switching of magnetization orientation of each of said FM free layers is determined in response to the applied voltage which induces magnetization rotation and allows full switching to occur in response to presence of a stray magnetic field to switch magnetization to its final switched state in said first FM free layer and said second FM free layer.

6. The apparatus recited in claim 5, wherein said at least one stray field arises from said ferromagnetic (FM) fixed layer.

7. The apparatus recited in claim 1, wherein each said ferromagnetic (FM) free layer comprises one layer or a combination of layers.

8. The apparatus recited in claim 1, wherein said ferromagnetic (FM) fixed layer comprises one layer or a combination of layers.

9. The apparatus recited in claim 1, wherein said apparatus comprises an in-plane (IP) voltage-controlled magnetic anisotropy (VCMA) switch apparatus having two bits per cell.

10. The apparatus recited in claim 1, wherein said apparatus comprises an out-of-plane (OOP) voltage-controlled magnetic anisotropy (VCMA) switch apparatus having two bits per cell.

11. The apparatus recited in claim 1, wherein magnetization orientation of said apparatus can be read by measuring electrical resistance through the FM free layers, DE layers, and FM fixed layer in response to tunneling magnetoresistance (TMR) properties.

12. The apparatus recited in claim 1, wherein DE layer thickness differs between said first FM free layer and said FM fixed layer, and between said second FM free layer and said FM fixed layer, so that different tunneling resistances are created across each of the tunnel barriers leading to four different resistance states.

13. The apparatus recited in claim 1, wherein said ferromagnetic material is selected from the group of ferromagnetic materials consisting of Fe, Co, Pt, Pd, FePd, CoFe, and CoFeB.

14. The apparatus recited in claim 1, wherein said dielectric material comprises MgO.

15. The apparatus recited in claim 1, wherein said dielectric material comprises a material with a large dielectric constant which is equal to or larger than approximately 10.

16. The apparatus recited in claim 1, wherein said OOP anisotropy is tuned by placing an additional non-magnetic metal layer adjacent to an FM layer, where said metal layer increases said OOP anisotropy or said VCMA effect.

17. The apparatus recited in claim 16, where said metal layer comprises Tantalum (Ta) or Hafnium (Hf).

18. The apparatus recited in claim 1, wherein said OOP anisotropy is tuned by placing an additional dielectric layer adjacent to an FM layer, where said dielectric layer increases said OOP anisotropy or said VCMA effect.

19. The apparatus recited in claim 18, where said dielectric layer comprises Magnesium Oxide (MgO), Hafnium Oxide (HfOx), or Tantalum Oxide (TaOx).

20. The apparatus recited in claim 1, wherein said apparatus is incorporated as multiple bits within a multi-bit-per-cell (MBPC) magneto-electric random access memory (MeRAM) in which bit state is written to different FM free layers in response to application of a first and second voltage levels, at a first and second polarity.

* * * * *